(12) United States Patent
Park et al.

(10) Patent No.: US 11,439,012 B2
(45) Date of Patent: Sep. 6, 2022

(54) ELECTRONIC DEVICE INCLUDING IN INTERPOSER

(71) Applicant: Samsung Electronics Co., Ltd., Gyeonggi-do (KR)

(72) Inventors: Junghoon Park, Gyeonggi-do (KR); Seungbo Shim, Gyeonggi-do (KR); Seunggoo Kang, Gyeonggi-do (KR); Seockkeun Han, Gyeonggi-do (KR); Dongil Son, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/091,349

(22) Filed: Nov. 6, 2020

(65) Prior Publication Data
US 2021/0144856 A1    May 13, 2021

(30) Foreign Application Priority Data
Nov. 8, 2019    (KR) .......................... 10-2019-0142482

(51) Int. Cl.
*H05K 1/18*    (2006.01)
*H05K 1/14*    (2006.01)
*H05K 1/11*    (2006.01)

(52) U.S. Cl.
CPC ............. *H05K 1/145* (2013.01); *H05K 1/111* (2013.01); *H05K 1/144* (2013.01); *H05K 2201/042* (2013.01)

(58) Field of Classification Search
CPC ........ H05K 1/145; H05K 1/111; H05K 1/144; H05K 2201/042
(Continued)

(56) References Cited

U.S. PATENT DOCUMENTS 6,295,207 B1    9/2001  Jones
2001/0046129 A1*  11/2001  Broglia .................. H01R 12/52
                                                            361/803
(Continued)

FOREIGN PATENT DOCUMENTS

KR    1020090122757    12/2009
KR    1020130028243    3/2013
KR    1020190029215    3/2019

OTHER PUBLICATIONS

International Search Report dated Jan. 19, 2021 issued in counterpart application No. PCT/KR2020/013960, 3 pages.

*Primary Examiner* — Binh B Tran
(74) *Attorney, Agent, or Firm* — The Farrell Law Firm, P.C.

(57) ABSTRACT

Provided is an electronic device. The electronic device may include a housing; a first printed circuit board (PCB) disposed in an internal space of the housing and including a plurality of first conductive terminals; a second PCB arranged parallel to the first PCB in the internal space, and including a plurality of second conductive terminals; and an interposer disposed between the first PCB and the second PCB to electrically connect the first PCB and the second PCB, the interposer including: a dielectric substrate including a first substrate surface facing the first PCB, a second substrate surface facing the second PCB, and a substrate side surface surrounding a space between the first substrate surface and the second substrate surface; a plurality of conductive vias formed to penetrate from the first substrate surface of the dielectric substrate to the second substrate surface, and electrically connecting the plurality of first conductive terminals to the plurality of second conductive terminals; and a first conductive pattern formed from at least a portion of the substrate side surface to the first PCB, wherein the first conductive pattern may be electrically (Continued)

connected to a first conductive pad formed on the first PCB and electrically connected to the at least one first electrical element.

8 Claims, 12 Drawing Sheets

(58) Field of Classification Search
USPC .......................................................... 361/784
See application file for complete search history.

(56) References Cited

U.S. PATENT DOCUMENTS

| | | | |
|---|---|---|---|
| 2005/0168961 A1* | 8/2005 | Ono | H05K 1/144 |
| | | | 361/784 |
| 2008/0155820 A1* | 7/2008 | Arai | H01L 21/565 |
| | | | 29/830 |
| 2012/0243195 A1 | 9/2012 | Lim et al. | |
| 2014/0055159 A1 | 2/2014 | Shelsky et al. | |
| 2018/0084680 A1* | 3/2018 | Jarvis | H05K 1/0216 |
| 2019/0082536 A1 | 3/2019 | Park et al. | |

* cited by examiner

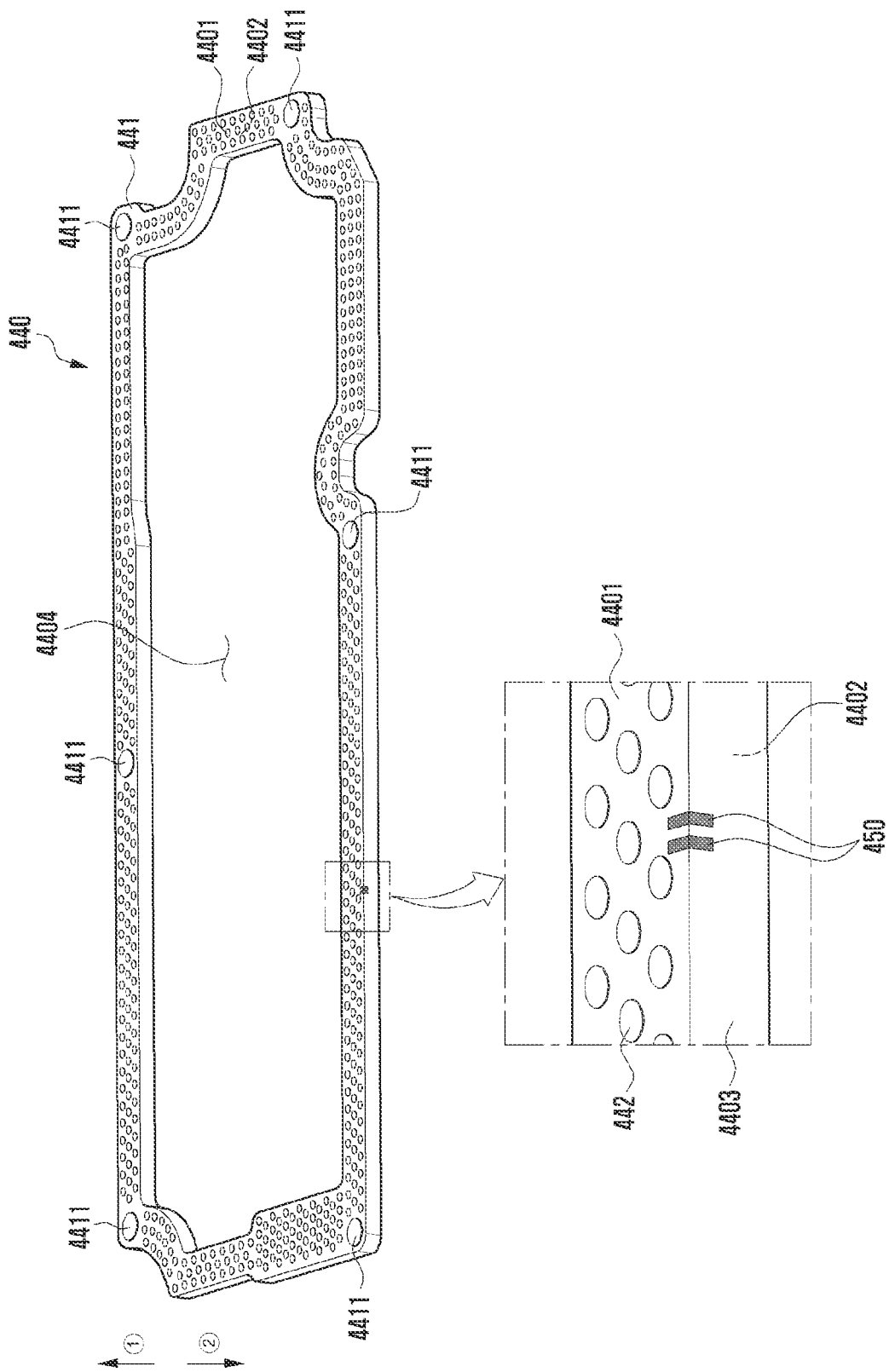

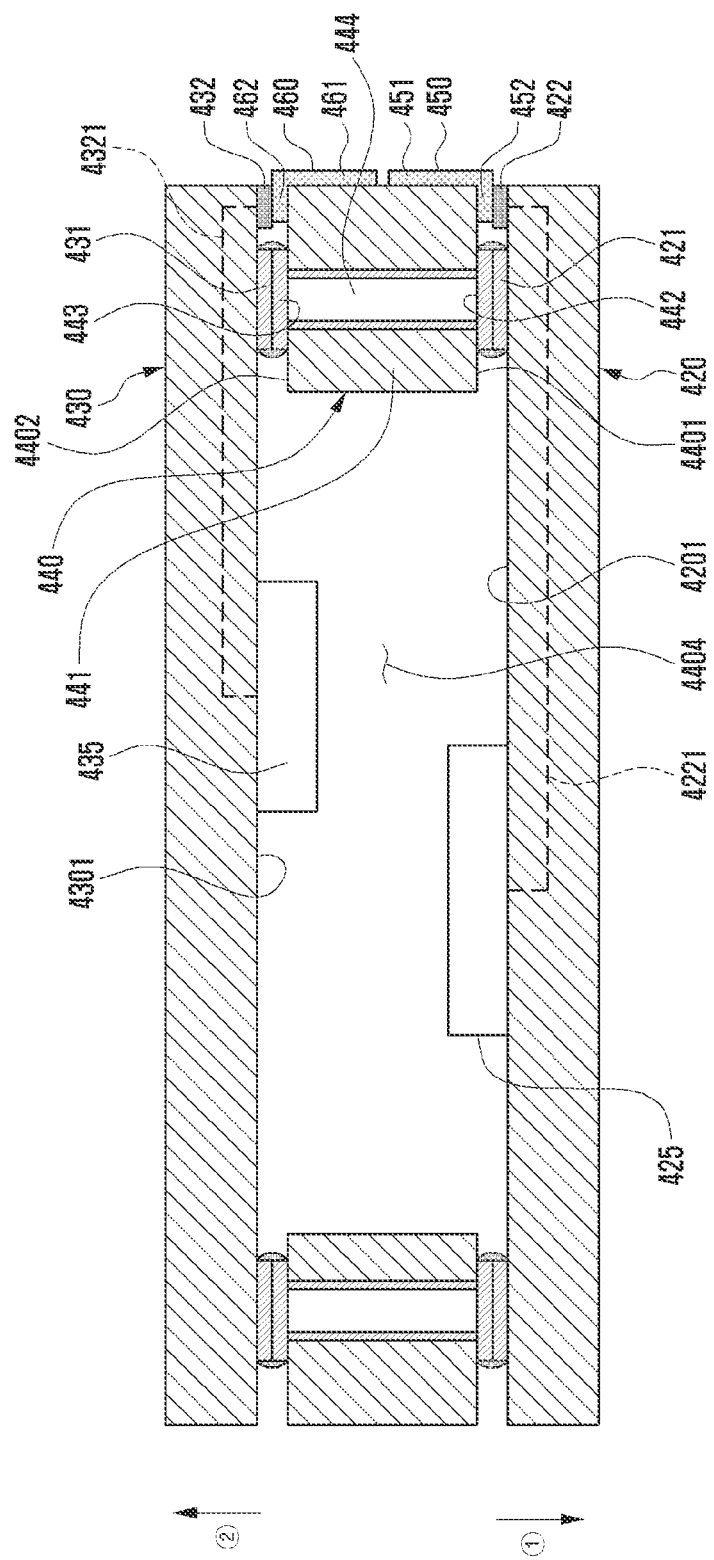

ELECTRONIC DEVICE INCLUDING IN INTERPOSER

CROSS-REFERENCE TO RELATED APPLICATION(S)

This application is based on and claims priority under 35 U.S.C. § 119 to a Korean Patent Application No. 10-2019-0142482, filed on Nov. 8, 2019, in the Korean Intellectual Property Office, the disclosure of which is incorporated herein by reference in its entirety.

BACKGROUND

1. Field

Various embodiments of the disclosure relate to an electronic device including an interposer.

2. Description of Related Art

Electronic devices are becoming slimmer to stay competitive against other manufacturers and are being upgraded so as to increase rigidity, enhance design aspects, and differentiate functional elements.

A plurality of electronic components disposed in the internal space of an electronic device must be efficiently arranged with respect to each other to help make the electronic device slimmer. Further, although a plurality of electronic components may be efficiently arranged in the internal space of the electronic device, if their functions are not properly performed, the quality of the electronic device may deteriorate. Hence, electronic devices have been developed to satisfy these conditions.

An electronic device may include one or more electronic components disposed in the internal space. The one or more electronic components may be electrically connected to each other to perform corresponding functions of the electronic device. Such electronic components may include at least two printed circuit boards (PCBs) disposed in the internal space of the electronic device. The PCBs may be arranged in a stacked manner to secure an efficient mounting space, and may be electrically connected to each other through an interposer (e.g., stacked PCB) interposed therebetween. For example, each PCB may include plural conductive terminals and may be brought into physical contact with plural conductive terminals disposed on the corresponding surface of the interposer, so that the two PCBs can be electrically connected.

The plural electrical elements mounted on the two PCBs arranged with an interposer therebetween can be tested for correct performance after being mounted on the boards. Hence, for the PCB, a test point electrically connected to electrical elements and exposed on the outer surface of the PCB may be required in addition to the above-described conductive terminals.

However, such a test point may impose limitations on the design of a PCB, and an increase in the volume of the PCB due to the additional arrangement of the test point may cause a problem of reducing the placement space for peripheral electronic components such as a battery. Moreover, when the test point is placed on the corresponding PCB by using an interposer, the volume of the interposer may increase due to the addition of a conductive via.

SUMMARY

An aspect of the disclosure is to provide an electronic device including an interposer.

Another aspect of the disclosure is to provide an electronic device including an interposer capable of providing a test point for electrical elements arranged on PCBs without increasing the size.

According to an embodiment, an electronic device is provided. The electronic device includes a housing; a first printed circuit board (PCB) disposed in an internal space of the housing, including at least one first electrical element, and including a plurality of first conductive terminals; a second PCB arranged parallel to the first PCB in the internal space, and including a plurality of second conductive terminals; and an interposer disposed between the first PCB and the second PCB to electrically connect the first PCB and the second PCB, the interposer including a dielectric substrate including a first substrate surface facing the first PCB, a second substrate surface facing the second PCB, and a substrate side surface surrounding the space between the first substrate surface and the second substrate surface; a plurality of conductive vias formed to penetrate from the first substrate surface of the dielectric substrate to the second substrate surface, and electrically connecting the plurality of first conductive terminals to the plurality of second conductive terminals; and a first conductive pattern formed from at least a portion of the substrate side surface to the first PCB, wherein the first conductive pattern may be electrically connected to a first conductive pad formed on the first PCB and electrically connected to the at least one first electrical element.

According to an embodiment, an electronic device is provided. The electronic device includes a housing; a first printed circuit board (PCB) disposed in an internal space of the housing, including at least one electrical structure, and including a plurality of first conductive terminals; a second PCB arranged parallel to the first PCB in the internal space, and including a plurality of second conductive terminals; and an interposer disposed between the first PCB and the PCB board to electrically connect the first PCB and the second PCB, the interposer including a dielectric substrate including a first substrate surface facing the first PCB, a second substrate surface facing the second PCB, and a substrate side surface surrounding the space between the first substrate surface and the second substrate surface; a plurality of conductive vias formed to penetrate from the first substrate surface of the dielectric substrate to the second substrate surface and electrically connecting the plurality of first conductive terminals to the plurality of second conductive terminals; and a conductive pattern formed on the substrate side surface from the first PCB to the second PCB, wherein one end of the conductive pattern may be electrically connected to a first conductive pad formed on the first PCB and electrically connected to the at least one electrical structure, wherein the other end of the conductive pattern may be electrically connected to a second conductive pad formed on the second PCB.

BRIEF DESCRIPTION OF THE DRAWINGS

The above and other aspects, features and advantages of certain embodiments of the disclosure will be more apparent from the following detailed description, taken in conjunction with the accompanying drawings, in which the same or similar reference symbols may be used to refer to the same or like parts, and in which:

FIG. 5 illustrates a perspective view of an interposer according to an embodiment;

FIGS. 6A, 6B, 6C, 7 and 8 are partial cross-sectional views illustrating a state in which an interposer including at least one conductive pattern and PCBs are assembled together according to various embodiments;

DETAILED DESCRIPTION

Figure 1:
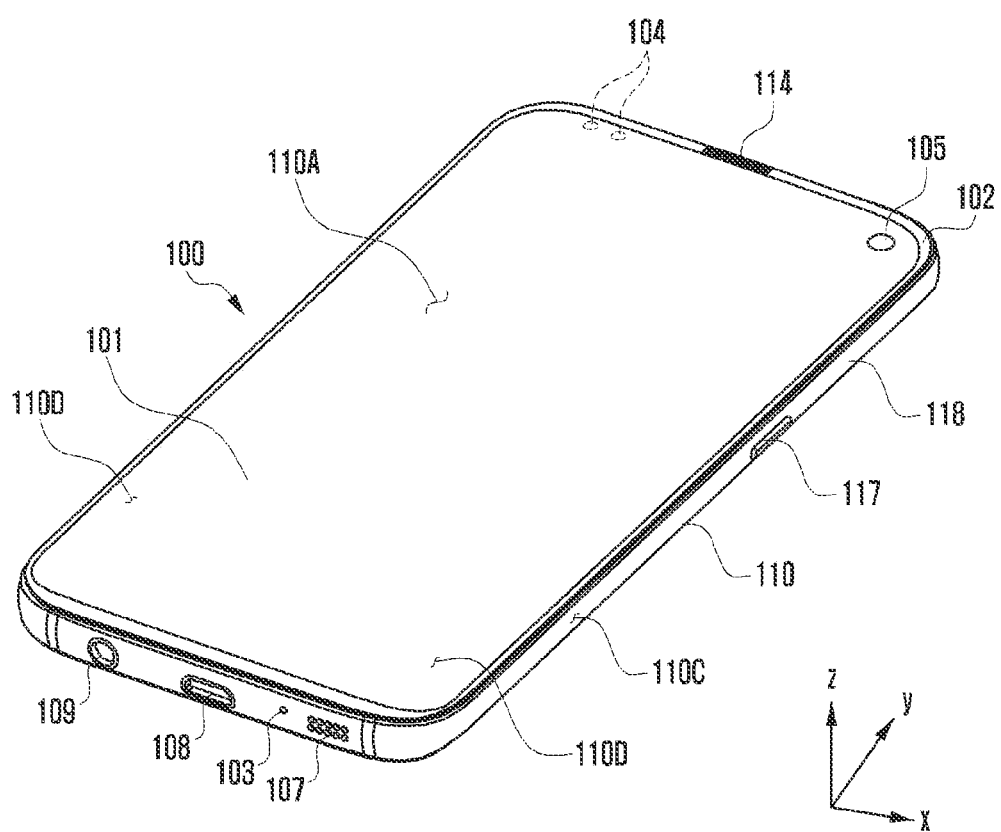
FIG. 1 illustrates a front perspective view of a mobile electronic device according to an embodiment.
Figure 2:
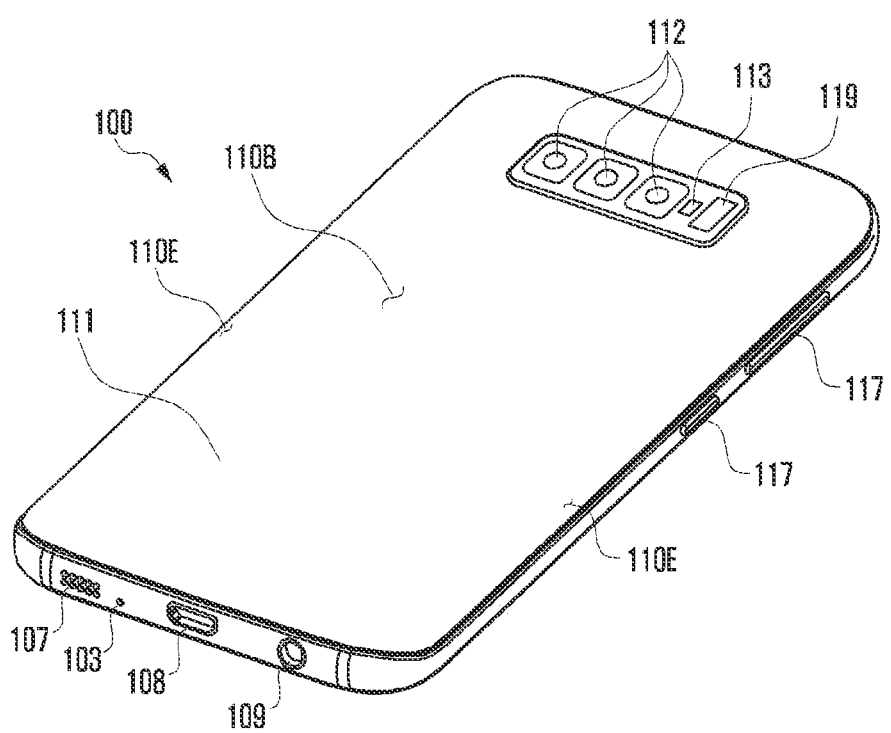
FIG. 2 is a rear perspective view of the electronic device shown in FIG. 1 according to an embodiment.

FIG. 1 illustrates a perspective view showing a front surface of a mobile electronic device according to an embodiment; and FIG. 2 illustrates a perspective view showing a rear surface of the mobile electronic device shown in FIG. 1 according to an embodiment.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, a fingerprint sensor, and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110I and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor (ISP). The flash 113 may include, for example, a light emitting diode or a xenon lamp. Two or more lenses (IR cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key, input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
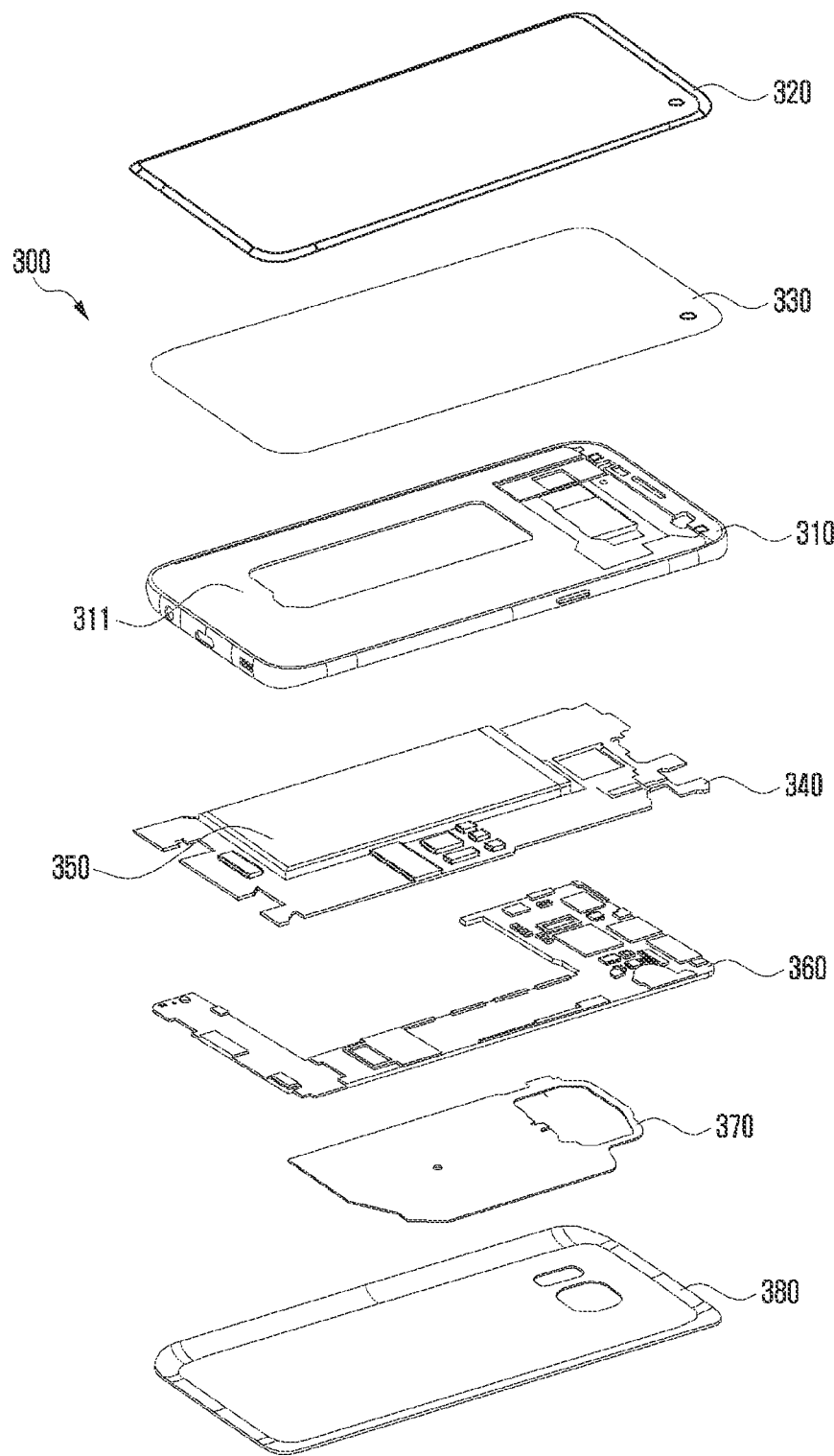
FIG. 3 is an exploded perspective view of the electronic device shown in FIG. 1 according to an embodiment.

FIG. 3 illustrates an exploded perspective view showing a mobile electronic device shown in FIG. 1 according to an embodiment.

Referring to FIG. 3, a mobile electronic device 300 may include a lateral bezel structure 310, a first support member 311 (e.g., a bracket), a front plate 320, a display 400, an electromagnetic induction panel, a PCB 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 400 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an ISP, a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NEC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
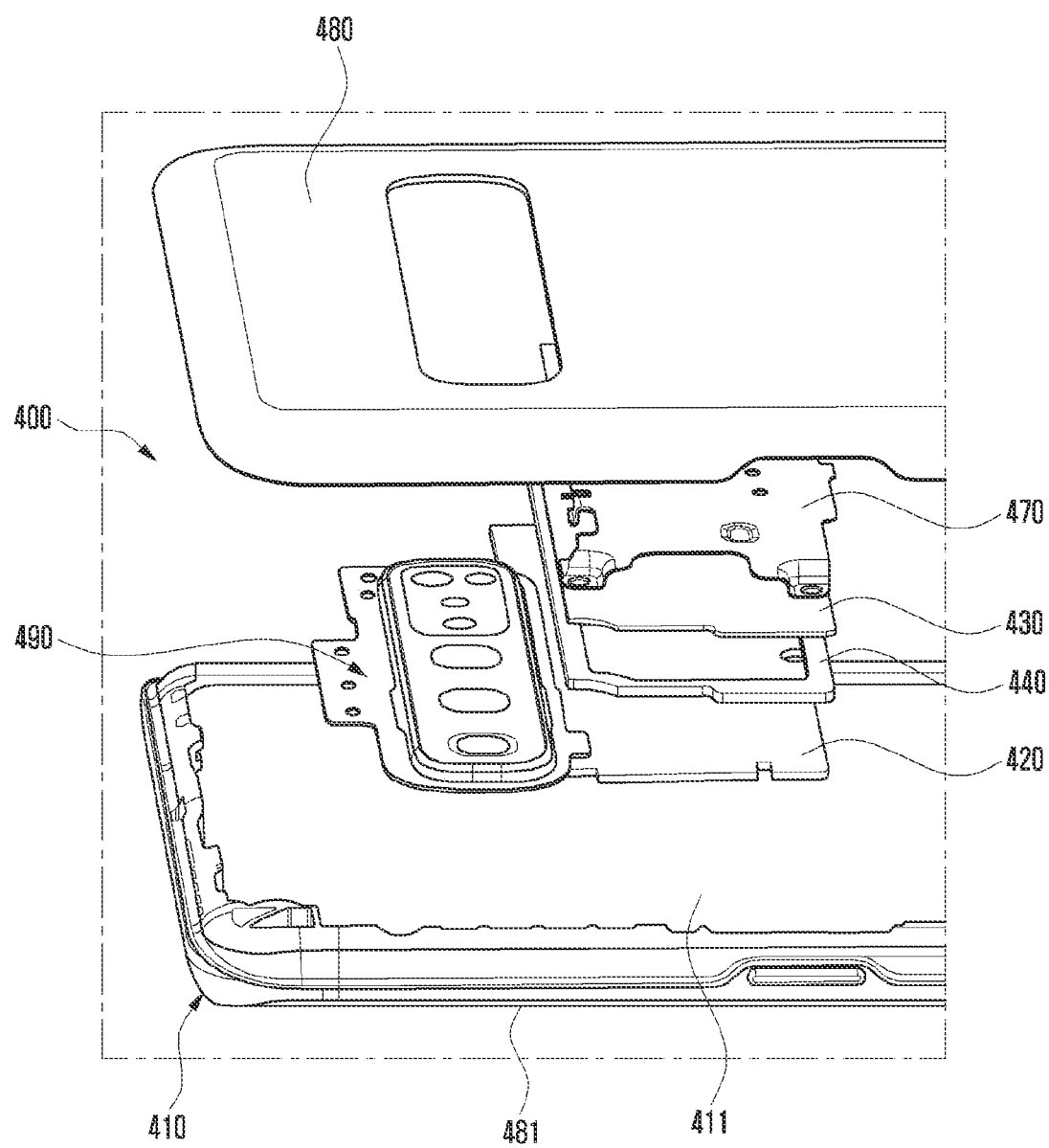
FIG. 4 illustrates the configuration of an electronic device to which an interposer is applied according to an embodiment.

FIG. 4 illustrates the configuration of an electronic device 400 to which an interposer 440 is applied according to an embodiment.

The electronic device 400 in FIG. 4 may include embodiments at least partly similar to or different from those of the electronic device 100 in FIG. 1 or 2 or the electronic device 300 of FIG. 3.

With reference to FIG. 4, the electronic device 400 (e.g., electronic device 300 in FIG. 3) may include a housing (e.g., housing 110 in FIG. 1A) that includes a front cover 481 (e.g., front plate 320 in FIG. 3), a rear cover 480 (e.g., rear plate 380 in FIG. 3) facing in the opposite direction of the front cover 481, and a side member 410 (e.g., side member 310 in FIG. 3) surrounding the space between the front cover 481 and the rear cover 480. In one embodiment, the electronic device 400 may include a first support member 411 (e.g., first support member 311 in FIG. 3) disposed in the internal space. In one embodiment, the first support member 411 may be formed to extend from the side member 410 to the internal space. In another embodiment, the first support member 411 may be separately formed in the internal space of the electronic device 400. In one embodiment, the first support member 411 may extend from the side member 410 and at least a portion thereof may be made of a conductive material. In one embodiment, the electronic device 400 may further include a camera structure 490 disposed in a space between the front cover 481 and the rear cover 480.

In various embodiments, the electronic device 400 may include a pair of PCBs 420 and 430 disposed between the first support member 411 and the rear cover 480 in the internal space. In one embodiment, the PCBs 420 and 430 may be arranged to at least partially overlap when the front cover 481 is viewed from above. In one embodiment, the first PCB 420 (e.g., main board) is disposed between the first support member 411 and the rear cover 480, and the second PCB 430 (e.g., sub board) is disposed between the first PCB 420 and the rear cover 480.

In an embodiment, the electronic device 400 may include an interposer 440 (e.g., stacked PCB) interposed between the first PCB 420 and the second PCB 430. In one embodiment, the interposer 440 may include a plurality of conductive terminals and may be in physical contact with conductive terminals disposed on the two PCBs 420 and 430, so that the two PCBs 420 and 430 may be electrically connected. For example, the interposer 440 may be preferentially mounted on the first PCB 420 through pre-solder applied to the conductive terminals. Alternatively, the interposer 440 may be preferentially mounted on the second PCB 420 through pre-solder applied to the conductive terminals. In one embodiment, the electronic device 400 may include a second support member 470 disposed between the second PCB 430 and the rear cover 480. In one embodiment, the second support member 470 may be disposed at a position at least partially overlapping the second PCB 430. In one embodiment, the second support member 470 may include a metal plate. Hence, the first PCB 420, the interposer 440, and the second PCB 430 may be fixed to the first support member 411 by use of the second support member 470 disposed thereon. For example, the second support member 470 may be fastened to the first support member 411 through a fastening member such as a screw, firmly supporting the electrical connection between the first PCB 420, the interposer 440, and the second PCB 430. In another embodiment, the first PCB 420, the interposer 440, and the second PCB 430 may be disposed in the internal space of the electronic device 400 without the second support member 470.

Next, a detailed description is given of the configuration of the interposer 440.

FIG. 5 is a perspective view of the interposer 440 according to an embodiment.

With reference to FIG. 5, the interposer 440 may include a dielectric substrate 441 that includes a first substrate surface 4401 facing in a first direction (①) direction) (e.g., direction toward the front cover 481 in FIG. 4), a second substrate surface 4402 facing in the opposite direction (② direction) of the first substrate surface 4401 (e.g., direction toward the rear cover 480 in FIG. 4), and a substrate side surface 4403 surrounding the space between the first substrate surface 4401 and the second substrate surface 4402. In one embodiment, the interposer 440 may include a plurality of conductive terminals 442 (e.g., multiple third conductive terminals 442 and multiple fourth conductive terminals 443 in FIG. 6) that are disposed at regular or irregular intervals on the first substrate surface 4401 and the second substrate surface 4402 and are exposed to the outside. In one embodiment, the plural conductive terminals 442 may have different sizes, and may be arranged at regular or irregular intervals. For example, among the plural conductive terminals 442, at least one conductive terminal connected to the ground may be formed to be larger than at least one conductive terminal used for signal transmission. In one embodiment, the plural conductive terminals 442 may be electrically connected through a conductive via 444 in FIG. 6, or a conductive post penetrating from the first substrate surface 4401 of the dielectric substrate 441 to the second substrate surface 4402. In one embodiment, the interposer 440 may include at least one screw fastening portion 4411 disposed in at least a portion. In one embodiment, the interposer 440 may be fixed to at least one support structure (e.g., first support member 411 and/or second support member 470 in FIG. 4) disposed inside the electronic device (e.g., electronic device 400 in FIG. 4) through the screw fastening portion 4411.

In various embodiments, the interposer 440 may have substantially the same shape as at least one PCB among the first PCB (e.g., first printed circuit board 420 in FIG. 4) and the second PCB (e.g., second printed circuit board 430 in FIG. 4), and it may include an opening 4404 formed in the center. In another embodiment, the interposer 440 may be formed to have an at least partially different shape from at least one PCB among the first PCB (e.g., first printed circuit board 420 in FIG. 4) and the second PCB (e.g., second printed circuit board 430 in FIG. 4). In one embodiment, the opening 4404 may be utilized as a receiving space for accommodating electrical elements or a shield can arranged on at least one of the two PCBs 420 and 430.

In an embodiment, the interposer 440 may include at least one conductive pattern 450 (e.g., first conductive pattern 450 in FIG. 6) disposed to be exposed to the outside of the substrate side surface 4403. In one embodiment, the at least one conductive pattern 450 may include at least one of a metal plate, conductive paint, conductive tape, or conductive deposition material disposed on the outside of the substrate side surface 4403. In one embodiment, the at least one conductive pattern 450 may be arranged to extend from the substrate side surface 4403 to at least a portion of the first substrate surface 4401. In one embodiment, when the interposer 440 is coupled to the first PCB (e.g., first printed circuit board 420 in FIG. 6), the at least one conductive pattern 450 may be electrically connected to at least one electrical element (e.g., electrical element 425 in FIG. 6) mounted on the first PCB 420, and may be arranged to be in electrical and physical contact with a conductive pad (e.g., first conductive pad 422 of FIG. 6) disposed to be exposed on the outer surface. In one embodiment, the at least one electrical element 425 may include at least one of a power management integrated circuit (PMIC), a radio frequency integrated circuit (RFIC), or a processor (e.g., an AP and/or a CP). Hence, the conductive pattern can be used as a probe to test the performance of at least one electrical element.

According to an embodiment, because the conductive pattern 450 used as a test point is disposed on the substrate side surface 4403 of the interposer 440, although the first PCB 420 and the second PCB 430 are coupled through the interposer 440 and at least one electrical element 425 is hidden, it is possible to perform performance testing through the conductive pattern 450. In addition, the conductive pattern 450 used as a test point is disposed to be exposed on the substrate side surface 4403 of the interposer 440, helping to make the interposer 440 slimmer and to improve the degree of freedom for mounting electrical elements on the two PCBs 420 and 430.

FIGS. 6A, 6B, 6C, 7 and 8 are partial cross-sectional views illustrating a state in which the interposer 440 including at least one conductive pattern and the PCBs 420 and 430 are assembled together according to an embodiment.

Figure 6A:
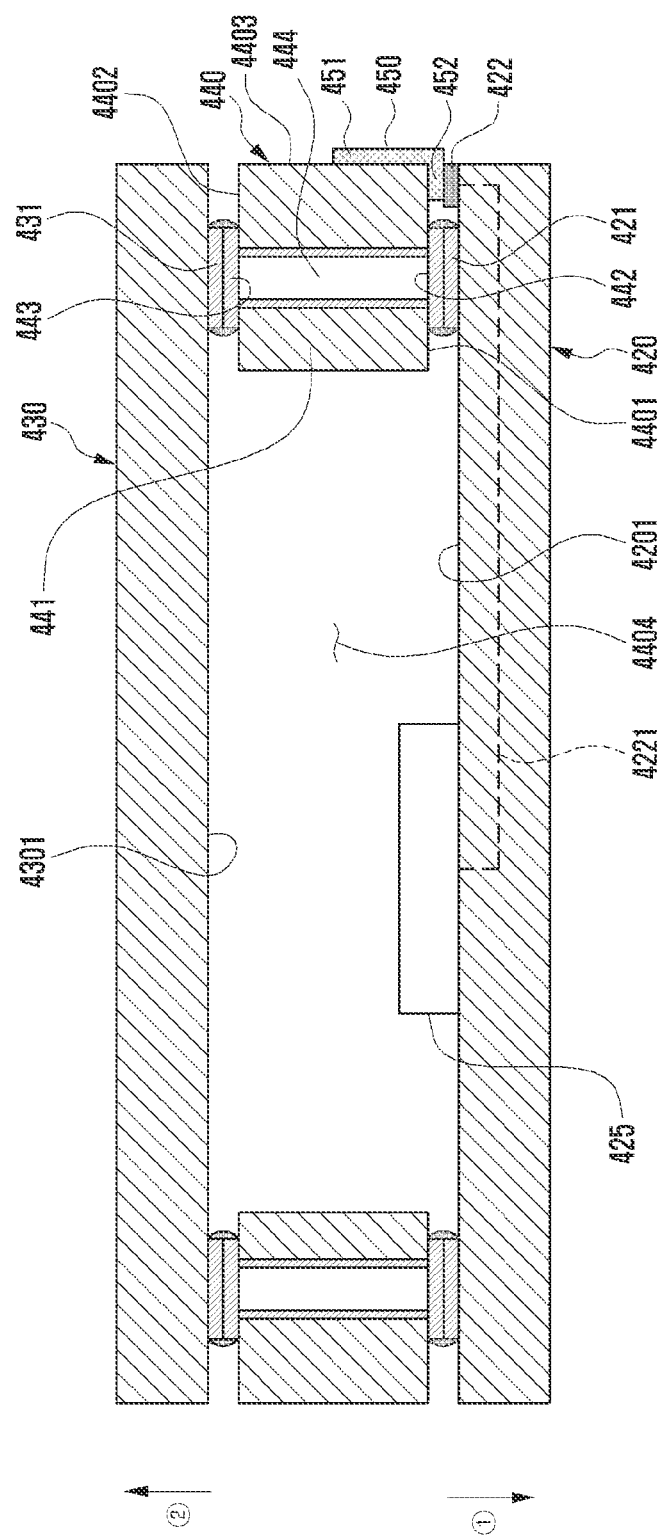

With reference to FIG. 6A, the electronic device (e.g., electronic device 400 in FIG. 4) may include a first PCB 420 disposed in the internal space and including a plurality of first conductive terminals 421, a second PCB 430 disposed substantially parallel to the first PCB 420 and including a plurality of second conductive terminals 431, and an interposer 440 disposed between the first PCB 420 and the second PCB 430 to electrically connect the first PCB 420 and the second PCB 430. In one embodiment, the first PCB 420 may include at least one first electrical element 425 that faces the second PCB 430 and is disposed on the first corresponding surface 4201 of the first PCB 420 at a position corresponding to the opening 4404 of the interposer 440.

In various embodiments, the interposer 440 may include a dielectric substrate 441 that includes a first substrate surface 4401 facing the first PCB 420 (e.g., main board), a second substrate surface 4402 facing away from the first substrate surface 4401 and facing the second PCB 430 (e.g., sub board), and a substrate side surface 4403 formed to surround the space between the first substrate surface 4401 and the second substrate surface 4402. In one embodiment, the interposer 440 may include a plurality of third conductive terminals 442 that are disposed on the first substrate surface 4401 to respectively face the first conductive terminals 421 disposed on one surface 4201 (e.g., first corresponding surface 4201) of the first PCB 420. In one embodiment, the interposer 440 may include a plurality of fourth conductive terminals 443 that are disposed on the second substrate surface 4402 to respectively face the second conductive terminals 431 disposed on one surface 4301 (e.g., second corresponding surface 4301) of the second PCB 430. In one embodiment, the third conductive terminals 442 and the fourth conductive terminals 443 may be electrically connected respectively through a conductive via 444 (e.g., conductive post) arranged to penetrate from the first substrate surface 4401 of the dielectric substrate 441 to the second substrate surface 4402. In one embodiment, the interposer 440 may include pre-solder (PS) arranged so as to electrically and physically connect the third conductive terminals 442 to the first conductive terminals 421 and electrically and physically connect the fourth conductive terminals 443 to the second conductive terminals 431. In one embodiment, the pre-solder PS can bind individual terminals through a reflow process when the first PCB 420 and the second PCB 430 are coupled to the interposer 440. In one embodiment, the reflow process may be a process for soldering a circuit board by supplying solder in advance to a land of the substrate and melting the solder with an external heat source for bonding. Here, the soldering process is not limited to reflow soldering, and various conductive bonding methods such as flow soldering other than reflow soldering may be used.

In an embodiment, the interposer 440 may include a first conductive pattern 450 disposed on at least some of the substrate side surface 4403 of the dielectric substrate 441. In one embodiment, the first conductive pattern 450 may include at least one of a metal plate, conductive paint, conductive tape, or conductive deposition material disposed on the substrate side surface 4403. In one embodiment, the first conductive pattern 450 may include a first exposed portion 451 disposed on the substrate side surface 4403, and a first contact portion 452 extending from the first exposed portion 451 to at least a portion of the first substrate surface 4401.

In various embodiments, the first PCB 420 may include a first conductive pad 422 disposed at a position facing the first contact portion 452 on the first corresponding surface 4201 facing the interposer 440. In one embodiment, the first conductive pad 422 may include a conductive pattern formed to be exposed on the first corresponding surface 4201 of the first PCB 420. In one embodiment, the first conductive pad 422 may be electrically connected to the first electrical element 425 through a first electrical path 4221 (e.g., electrical wiring) disposed inside the first PCB 420. Hence, when the interposer 440 and the first PCB 420 are combined, the first electrical element 425 may remain in an electrically connected state with the first conductive pattern 450 through the first electrical path 4221, the first conductive pad 422, the first contact portion 452, and the first exposed portion 451. In one embodiment, the first contact portion 452 and the first conductive pad 422 may be electrically connected to each other through at least one of soldering, conductive bonding, or conductive tape. In this case, it is possible to test the performance of the least one first electrical element 425 by bringing the probe of a test equipment into contact with the first exposed portion 451 of the first conductive pattern 450.

In another embodiment, a plurality of electrical elements may be arranged on the first PCB 420, and the electrical elements may be individually tested for their performance through plural first conductive patterns that are arranged to correspond to the substrate side surface through the same connection method.

Figure 6B:
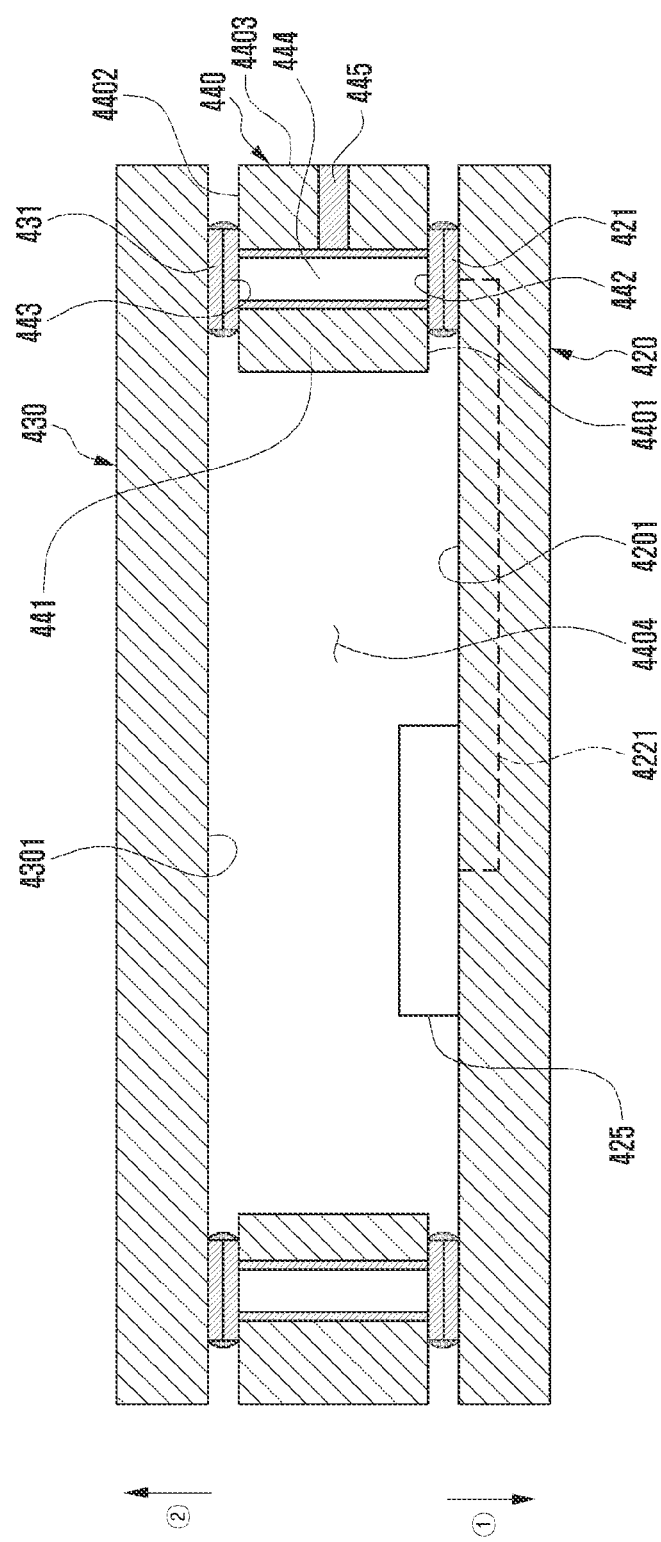
Figure 6C:
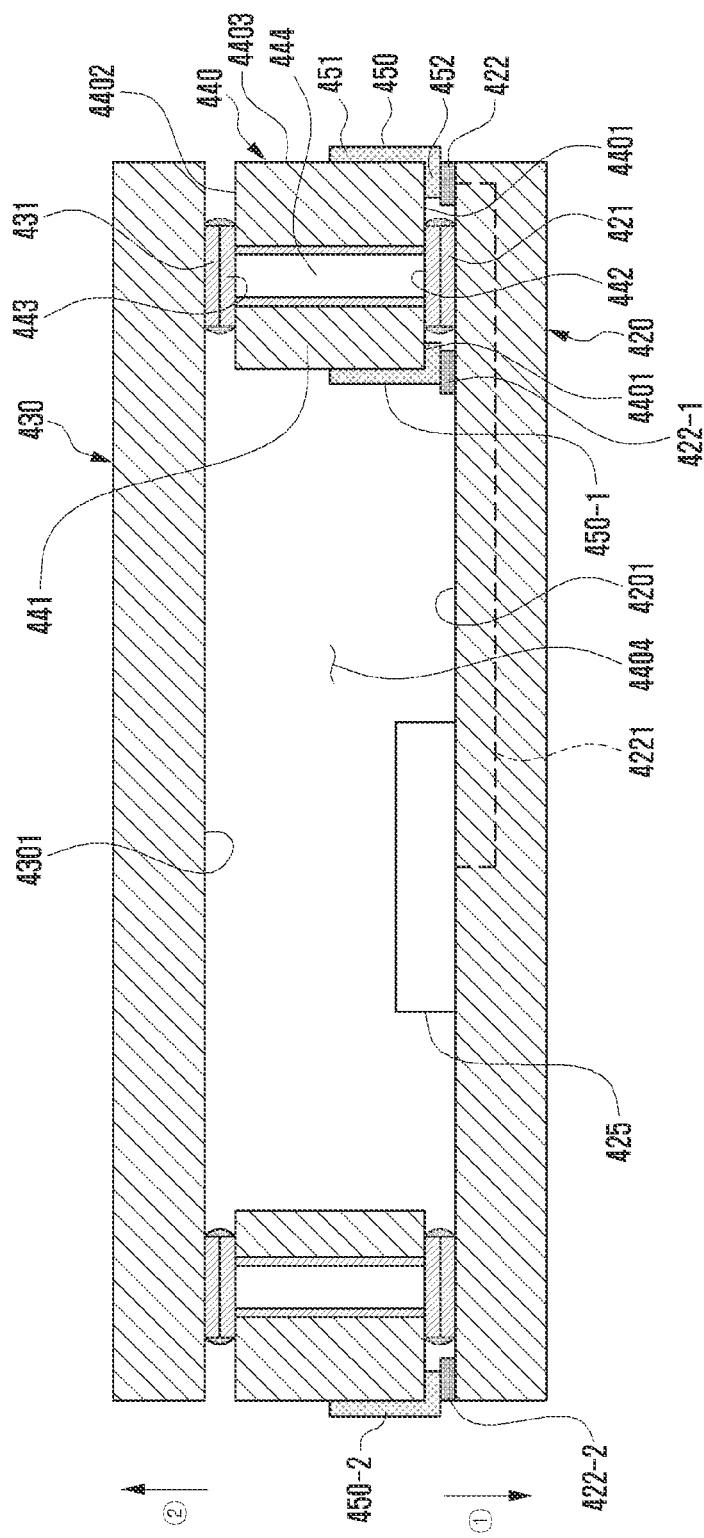

In FIGS. 6B and 6C, the same reference numerals are assigned to substantially the same components, and detailed descriptions thereof may be omitted.

With reference to FIG. 6B, the interposer 440 may include a conductor 445 filling a hole that is formed to be substantially parallel to (or may not be parallel to) the first PCB 420 from the conductive via 444 inside the dielectric substrate 441. In one embodiment, the conductor 445 may be disposed such that one end is electrically connected to the conductive via 444 and the other end is exposed on the substrate side surface 4403 of the interposer 440. In this case, one of the first conductive terminals 421 of the first PCB 420 electrically connected to one of the third conductive terminals 442 disposed on the interposer 440 and connected to the conductive via 444 may be electrically connected to the first electrical path 4221 disposed inside the first PCB 420 and connected to the first electrical element 425. Hence, even if the first conductive pattern 450 as shown in FIG. 6A is not included, the interposer 440 may have an electrical connection structure connected to the first electrical element 425 through the conductor 445 exposed on the substrate side surface 4403.

In another embodiment, the first electrical path 4221 may be electrically connected to a conductive portion formed to be exposed on the side surface of the first PCB 420 without passing through the interposer 440, thereby providing an electrical connection structure with the first electrical element 425 through the conductive portion.

With reference to FIG. 6C, the interposer 440 may include additional conductive patterns 450-1 and 450-2 disposed at one or more different parts of the substrate side surface 4403 where the first conductive pattern 450 is not disposed. In this case, the additional conductive patterns 450-1 and 450-2 may be disposed through the inner surface of the substrate facing the opening 4404 of the interposer 440 (conductive pattern 450-1), or may be disposed to be exposed at the different part of the substrate side surface 4403 (conductive pattern 450-2). In one embodiment, the additional conductive patterns 450-1 and 450-2 may be electrically connected respectively to additional conductive pads 422-1 and 422-2 disposed on the first corresponding surface 4201 of the first PCB 420. Hence, the interposer 440 may help expand electrical signal lines with the first PCB 420 through the additional conductive patterns 450-1 and 450-2. In another embodiment, the additional conductive patterns 450-1 and 450-2 may also be disposed between the interposer 440 and the second PCB 430 in a substantially identical manner.

Figure 8:
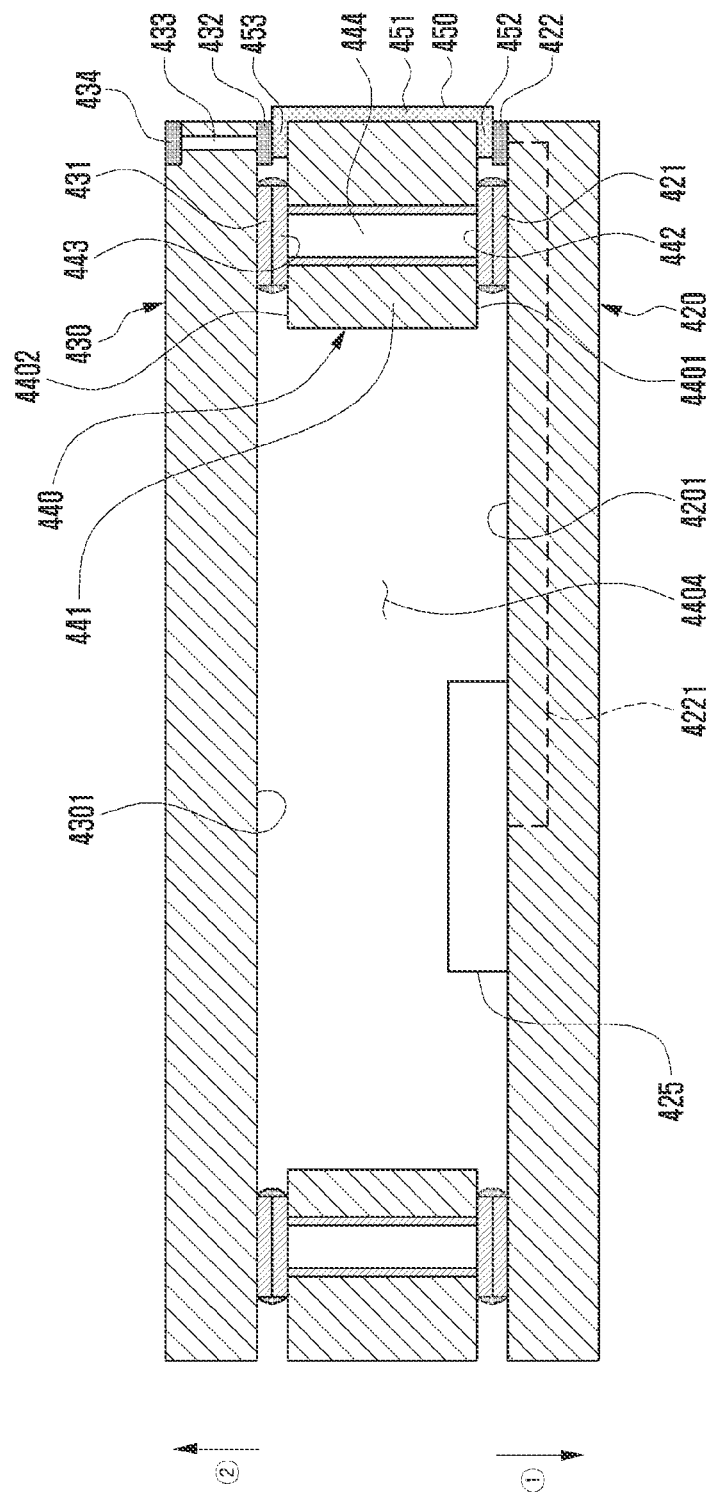

In FIGS. 7 and 8, the same reference numerals are assigned to substantially the same components, and detailed descriptions thereof may be omitted.

With reference to FIG. 7, the interposer 440 may further include a second conductive pattern 460 disposed on the same substrate side surface 4403 to test at least one second electrical element 435 mounted on the second PCB 430.

In an embodiment, the interposer 440 may include a second conductive pattern 460 disposed on at least some of the substrate side surface 4403 of the dielectric substrate 441. In one embodiment, the second conductive pattern 460 may be arranged to be electrically disconnected from the first conductive pattern 450. In one embodiment, the second conductive pattern 460 may include a second exposed portion 461 disposed on the substrate side surface 4403 and a second contact portion 462 extending from the second exposed portion 461 to at least a portion of the second substrate surface 4402.

In various embodiments, the second PCB 430 may include a second conductive pad 432 disposed at a position facing the second contact portion 462 on the second corresponding surface 4301 facing the interposer 440. In one embodiment, the second conductive pad 432 may include a conductive pattern formed to be exposed on the second corresponding surface 4301 of the second PCB 430. In one embodiment, the second conductive pad 432 may be electrically connected to the at least one second electrical element 435 through a second electrical path 4321 (e.g., electrical wiring) disposed inside the second PCB 430. Hence, when the interposer 440 and the second PCB 430 are combined, the at least one second electrical element 435 may remain in an electrically connected state with the second conductive pattern 460 through the second electrical path 4321, the second conductive pad 432, the second contact portion 462, and the second exposed portion 461. In one embodiment, the second contact portion 462 and the second conductive pad 432 may be electrically connected to each other through at least one of soldering, conductive bonding, or conductive tape. In this case, it is possible to test the performance of the least one second electrical element 435 by bringing the probe of a test equipment into contact with the second exposed portion 461 of the second conductive pattern 460.

In various embodiments, in a state where the first PCB 420, the interposer 440, and the second PCB 430 are coupled to each other, the first conductive pattern 450 and the second conductive pattern 450 acting as a test point for testing the performance of the electrical elements 425 and 435 arranged on the first PCB 420 and/or the second PCB 430 are both disposed on the substrate side surface 4403 of the interposer 440. This can help to slim the interposer 440 and efficiently mount the electrical elements 425 and 435 on the PCBs 420 and 430.

With reference to FIG. 8, in a state where the first PCB 420, the interposer 440, and the second. PCB 430 are coupled to each other, even in a mounting environment in which the first conductive pattern 450 cannot be used as a test point, the performance of the at least one first electrical element 425 disposed on the first PCB 420 may be tested through a third conductive pad 434 disposed on the second PCB 430.

In an embodiment, the first conductive pattern 450 may include a third contact portion 453 extending from the first exposed portion 451 to at least a portion of the second substrate surface 4402. In one embodiment, the third contact portion 453 may be electrically connected to the second conductive pad 432 disposed on the second corresponding surface 4301 of the second PCB 430. In one embodiment, the second PCB 430 may include a third conductive pad 434 that is disposed to be exposed on the outer surface of the second PCB 430 and is electrically connected to the second conductive pad 432 through the conductive via 433. In one embodiment, the third conductive pad 434 may be electrically connected to the at least one first electrical element 425 through the conductive via 433, the second conductive pad 432, the first conductive pattern 450, the first conductive pad 422, and the first electrical path 4221. Hence, it is possible to test the performance of the least one first electrical element 425 by bringing the probe of a test equipment into contact with the third conductive pad 434.

In another embodiment, the first conductive pattern 450 may be electrically connected to ground of the first PCB 420 and/or the second PCB 430. In this case, the first conductive pattern 450 may help to shield peripheral electrical elements (e.g., RFIC) and/or expand the ground.

Figure 9A:
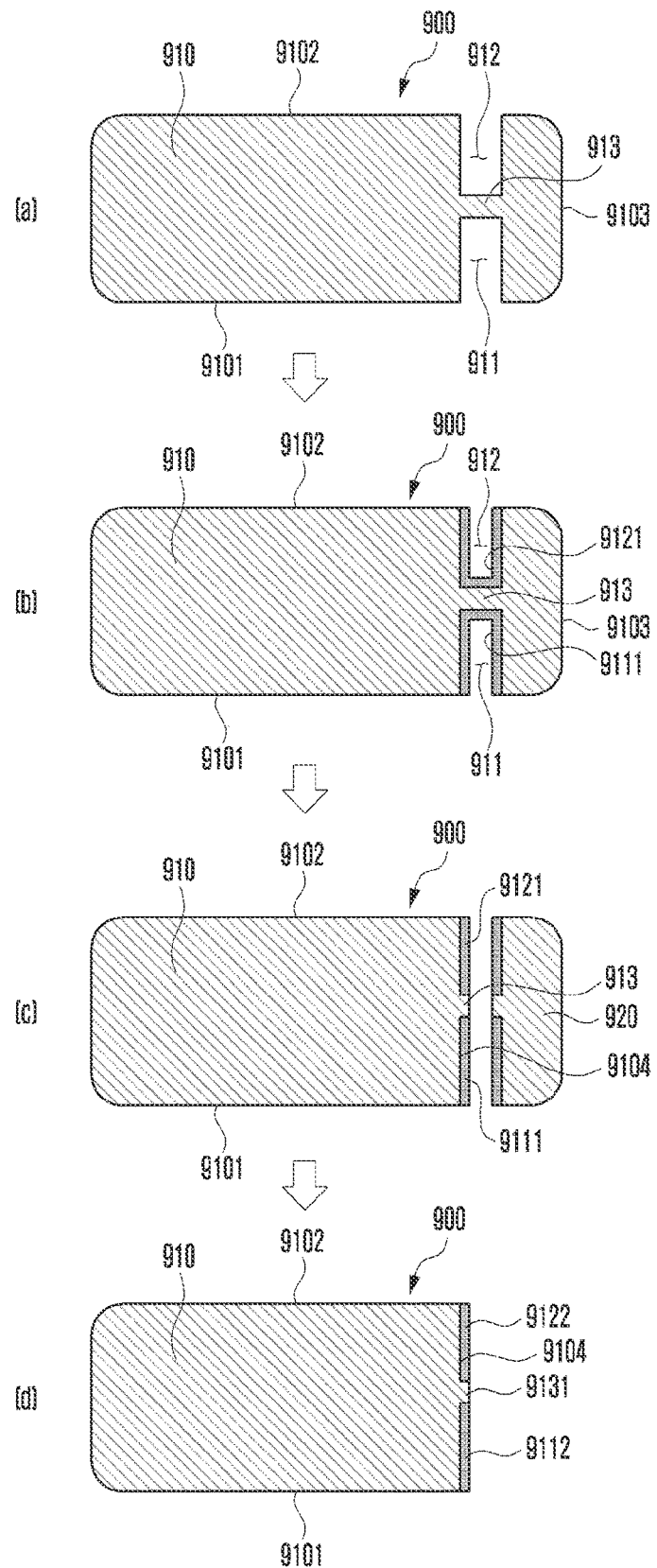
FIG. 9A illustrates a manufacturing process of the interposer for forming a conductive pattern according to an embodiment.
Figure 9B:
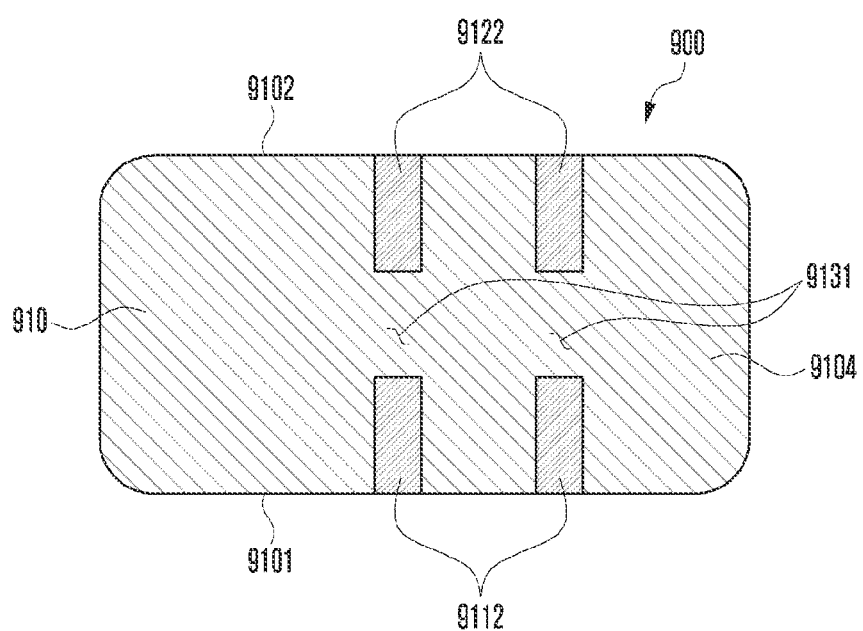
FIG. 9B is a view of the substrate side surface of the interposer completed in part (d) of FIG. 9A according to an embodiments.

FIG. 9A illustrates a manufacturing process of the interposer 900 for forming a conductive pattern 9112 or 9122 according to various embodiments. FIG. 9B is a view of the substrate side surface of the interposer 900 completed in part (d) of FIG. 9A according to an embodiment.

At least one conductive pattern among the conductive patterns 450, 450-1, 450-2 and 460 of FIGS. 6A to 8 may be formed by use of the manufacturing process of FIG. 9A.

The interposer 900 of FIG. 9A may include embodiments at least partially similar to or different from the interposer in FIG. 4.

With reference to FIGS. 9A and 9B, the interposer 900 (e.g., interposer 440 in FIG. 6) may include a dielectric substrate 910 (e.g., dielectric substrate 441 in FIG. 6) that includes a first substrate surface 9101 (e.g., first substrate surface 4401 in FIG. 6), a second substrate surface 9102 (e.g., second substrate surface 4402 in FIG. 6) facing in the opposite direction of the first substrate surface 9101, and an unprocessed substrate side surface 9103 surrounding the space between the first substrate surface 9101 and the second substrate surface 9102.

In part (a) of FIG. 9A, the interposer 900 may include a first hole 911 and/or a second hole 912 with a preset depth formed by drilling or punching around the unprocessed substrate side surface 9103. Here, the first hole 911 and the second hole 912 may be arranged to be separated by a partition wall 913 formed through the dielectric substrate 910 with adjustment of the drilling depth. For example, the first hole 911 may be formed in a direction from the first substrate surface 9101 to the second substrate surface 9102, and the second hole 912 may be formed in a direction from the second substrate surface 9102 to the first substrate surface 9101.

In part (b) of FIG. 9A, the interposer 900 may include conductive layers 9111 and 9121 formed inside the first hole 911 and the second hole 912 through a process of applying a conductive material to the first hole 911 and the second hole 912. For example, a first conductive layer 9111 may be formed in the first hole 911, and a second conductive layer 9121 may be formed in the second hole 912. In one embodiment, the first conductive layer 9111 and the second conductive layer 9121 may include a conductive paint, a metal, or a conductive deposition material.

In part (c) of FIG. 9A, a cutting process may be performed on the interposer 900 through the first hole 911, the partition wall 913, and the second hole 912. Through the cutting process, the unnecessary residual substrate 920 including the unprocessed substrate side surface 9103 may be removed.

In part (d) of FIG. 9A, after the residual substrate 920 is removed from the interposer 900 through the cutting process, the processed substrate side surface 9104 may be exposed to the outside. In one embodiment, the first conductive layer (e.g., first conductive layer 9111 in part (c)) remaining on the processed substrate side surface 9104 may function as the first conductive pattern 9112 (e.g., first conductive pattern 450 in FIG. 7), and the second conductive layer (e.g., second conductive layer 9121 in part (c)) remaining on the processed substrate side surface 9104 may function as the second conductive pattern 9122 (e.g., second conductive pattern 460 in FIG. 7). In one embodiment, the first conductive pattern and the second conductive pattern may remain in an electrically disconnected state through the remaining portion 9131 of the partition wall 913.

As at least one conductive pattern 9112 or 9122 is formed through a cutting process with a drilling operation applied to a conductive layer (e.g., plated layer) around the substrate side surface 9104, this may help prevent the volume of the interposer 900 from increasing.

An embodiment may provide a test point for electrical elements mounted on the PCBs without an increase in the volume of the interposer, and can help secure the degree of freedom for mounting electrical elements on the PCBs by moving the test point to the interposer.

According to an embodiment, an electronic device (e.g., electronic device 400 in FIG. 4) may include a housing (e.g., housing 410 in FIG. 4); a first PCB (e.g., first printed circuit board 420 in FIG. 6) disposed in an internal space of the housing, including at least one first electrical element (e.g., at least one first electrical element 425 in FIG. 6), and including a plurality of first conductive terminals (e.g., plural first conductive terminals 421 in FIG. 6); a second PCB (e.g., second printed circuit board 430 in FIG. 6) arranged parallel to the first PCB in the internal space, and including a plurality of second conductive terminals (e.g., plural second conductive terminals 431 in FIG. 6); and an interposer (e.g., interposer 440 in FIG. 6) that is disposed between the first PCB and the second PCB to electrically connect the first PCB and the second PCB and includes a dielectric substrate (e.g., dielectric substrate 441 in FIG. 6) including a first substrate surface (e.g., first substrate surface 4401 in FIG. 6) facing the first PCB, a second substrate surface (e.g., second substrate surface 4402 in FIG. 6) facing the second PCB, and a substrate side surface (e.g., substrate side surface 4403 in FIG. 6) surrounding the space between the first substrate surface and the second substrate surface; a plurality of conductive vias (e.g., conductive via 444 in FIG. 6) formed to penetrate from the first substrate surface of the dielectric substrate to the second substrate surface and electrically connecting the plurality of first conductive terminals to the plurality of second conductive terminals; and a first conductive pattern (e.g., first conductive pattern 450 in FIG. 6) formed from at least a portion of the substrate side surface to the first PCB, wherein the first conductive pattern may be electrically connected to a first conductive pad (e.g., first conductive pad 422 in FIG. 6) formed on the first PCB and electrically connected to the at least one first electrical element.

The first conductive pattern may include a first exposed portion (e.g., first exposed portion 451 in FIG. 6) formed on at least some of the substrate side surface and a first contact portion (e.g., first contact portion 452 in FIG. 6) extending from the first exposed portion to at least some of the first substrate surface facing the first PCB, and the first contact portion may be in physical and electrical contact with the first conductive pad.

The first contact portion may be electrically connected to the first conductive pad through at least one of soldering, conductive bonding, or conductive tape.

The first conductive pad may be electrically connected to the at least one first electrical element through a first conductive path (e.g., first conductive path 4221 in FIG. 6) disposed on the first PCB.

The first conductive pattern may be formed by forming a conductive layer inside a through hole formed to penetrate from the first substrate surface to the second substrate surface in the interposer and cutting the through hole in a direction from the first substrate surface to the second substrate surface.

The first conductive pattern may include at least one of a conductive paint, conductive tape, or a conductive plate disposed on the substrate side surface of the interposer.

The first conductive pattern may be used to test the performance of the at least one first electrical element by being brought into contact with the probe of a test equipment.

The interposer may further include a second conductive pattern (e.g., second conductive pattern 460 in FIG. 7) disposed on the substrate side surface, and the second conductive pattern may be electrically connected to a second conductive pad (e.g., second conductive pad 432 in FIG. 7) electrically connected to at least one second electrical element (e.g., at least one second electrical element 435 in FIG. 7) disposed on the second PCB.

The second conductive pattern may be disposed to be electrically disconnected from the first conductive pattern.

The second conductive pattern may include a second exposed portion (e.g., second exposed portion 461 in FIG. 7) formed on at least some of the substrate side surface and a second contact portion (e.g., second contact portion 462 in FIG. 7) extending from the second exposed portion to at least some of the second substrate surface facing the second PCB, and the second contact portion may be in physical and electrical contact with the second conductive pad.

The second contact portion may be electrically connected to the second conductive pad through at least one of soldering, conductive bonding, or conductive tape.

The second conductive pad may be electrically connected to the at least one second electrical element through a second conductive path (e.g., second conductive path 4321 in FIG. 7) disposed on the second PCB.

The first conductive pattern may be used to test the performance of the at least one second electrical element by being brought into contact with the probe of a test equipment.

The at least one first electrical element may include at least one of a power management integrated circuit (PMIC), a radio frequency integrated circuit (RFIC), or a processor (e.g., an AP and/or a CP).

The interposer may include an opening (e.g., opening 4404 in FIG. 6), and the at least one first electrical element may be accommodated in the opening.

According to an embodiment, an electronic device (e.g., electronic device 400 in FIG. 4) may include a housing (e.g., housing 410 in FIG. 4); a first PCB (e.g., first printed circuit board 420 in FIG. 8) disposed in an internal space of the housing, including at least one electrical structure (e.g., at least one electrical element 425 in FIG. 8), and including a plurality of first conductive terminals (e.g., plural first conductive terminals 421 in FIG. 8); a PCB (e.g., second printed circuit board 430 in FIG. 8) arranged parallel to the first PCB in the internal space, and including a plurality of second conductive terminals (e.g., plural second conductive terminals 431 in FIG. 8); and an interposer (e.g., interposer 440 in FIG. 8) that is disposed between the first PCB and the second PCB to electrically connect the first PCB and the second PCB and includes a dielectric substrate (e.g., dielectric substrate 441 in FIG. 8) including a first substrate surface (e.g., first substrate surface 4401 in FIG. 8) facing the first PCB, a second substrate surface (e.g., second substrate surface 4402 in FIG. 8) facing the second PCB, and a substrate side surface (e.g., substrate side surface 4403 in FIG. 8) surrounding the space between the first substrate surface and the second substrate surface; a plurality of conductive vias (e.g., conductive via 444 in FIG. 8) formed to penetrate from the first substrate surface of the dielectric substrate to the second substrate surface and electrically connecting the plurality of first conductive terminals to the plurality of second conductive terminals; and a conductive pattern (e.g., first conductive pattern 450 in FIG. 8) formed on the substrate side surface from the first PCB to the second PCB, wherein one end of the conductive pattern (e.g., first contact portion 452 in FIG. 8) may be electrically connected to a first conductive pad (e.g., first conductive pad 422 in FIG. 8) formed on the first PCB and electrically connected to the at least one electrical structure, and the other end of the conductive pattern (e.g., third contact portion 453 in FIG. 8) may be electrically connected to a second conductive pad (e.g., second conductive pad 432 in FIG. 8) formed on the second PCB.

The second PCB may be electrically connected to the second conductive pad, and may be electrically connected to a third conductive pad (e.g., third conductive pad 434 in FIG. 8) disposed to be exposed on the outer surface through a conductive via (e.g., conductive via 433 in FIG. 8).

The third conductive pad may be used to test the performance of the at least one electrical structure by being brought into contact with the probe of a test equipment.

The at least one electrical structure may include at least one of a power management integrated circuit (PMIC), a radio frequency integrated circuit (RFIC), or a processor (e.g., an AP and/or a CP).

The electrical structure may include a ground layer disposed on the first PCB.

Hereinabove, various embodiments of the disclosure have been shown and described for the purpose of illustration without limiting the subject matter of the disclosure. It should be understood by those skilled in the art that many variations and modifications of the basic inventive concept described herein will still fall within the spirit and scope of the disclosure as defined in the appended claims and their equivalents.

What is claimed is:

1. An electronic device comprising:
   a housing;
   a first printed circuit board (PCB) disposed in an internal space of the housing, including at least one first electrical element, and including a plurality of first conductive terminals;
   a second PCB arranged parallel to the first PCB in the internal space, and including a plurality of second conductive terminals; and
   an interposer disposed between the first PCB and the second PCB to electrically connect the first PCB and the second PCB, the interposer including:
   a dielectric substrate including a first substrate surface facing the first PCB, a second substrate surface facing the second PCB, and a substrate side surface surrounding a space between the first substrate surface and the second substrate surface;
   a plurality of conductive vias formed to penetrate from the first substrate surface to the second substrate surface, and electrically connecting the plurality of first conductive terminals to the plurality of second conductive terminals;
   a hole formed to penetrate from the substrate s surface to at least one conductive via of the plurality of conductive vias and arranged parallel to the first PCB; and
   a conductor filled in the hole,
   wherein the at least one conductive via is electrically connected to the at least one first electrical element through a first electrical path disposed inside the first PCB,
   wherein one end of the conductor is electrically connected to the at least one conductive via and the other end of the conductor is exposed on the substrate side surface, and
   wherein the conductor exposed on the substrate side surface is used to test performance of the at least one first electrical element by being brought into contact with a probe of test equipment.

2. The electronic device of claim 1, wherein the interposer further includes a conductive pattern disposed on the substrate side surface; and
   wherein the conductive pattern is electrically connected to a conductive pad electrically connected to at least one second electrical element arranged on the second PCB.

3. The electronic device of claim 2, wherein the conductive pattern is disposed to be electrically disconnected from the conductor.

4. The electronic device of claim 2, wherein the conductive pattern includes an exposed portion formed on at least some of the substrate side surface, and a contact portion extending from the exposed portion to at least some of the second substrate surface facing the second PCB; and
   wherein the contact portion is in physical and electrical contact with the conductive pad.

5. The electronic device of claim 4, wherein the contact portion is electrically connected to the conductive pad through at least one of soldering, conductive bonding, or conductive tape.

6. The electronic device of claim 2, wherein the conductive pad is electrically connected to the at least one second electrical element through a second conductive path disposed on the second PCB.

7. The electronic device of claim 1, wherein the at least one first electrical element includes at least one of a power management integrated circuit (PMIC), a radio frequency integrated circuit (RFIC), or a processor such as an application processor (AP) or a communication processor (CP).

8. The electronic device of claim 1, wherein the interposer includes an opening; and
   wherein the at least one first electrical element is accommodated in the opening.

* * * * *